(12) United States Patent
Kulkarni et al.

(10) Patent No.: US 8,488,390 B2
(45) Date of Patent: Jul. 16, 2013

(54) CIRCUITS AND METHODS FOR MEMORY

(75) Inventors: Jaydeep P. Kulkarni, Hillsboro, OR (US); Dinesh Somasekhar, Portland, OR (US); James W. Tschanz, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 143 days.

(21) Appl. No.: 13/174,352

(22) Filed: Jun. 30, 2011

(65) Prior Publication Data
US 2013/0003469 A1 Jan. 3, 2013

(51) Int. Cl.
*G11C 7/00* (2006.01)

(52) U.S. Cl.
USPC ............. 365/189.011; 365/154; 365/230.05

(58) Field of Classification Search
USPC ............... 365/154, 156, 185.07, 190, 198, 365/63, 230.05, 189.011
See application file for complete search history.

(56) References Cited

U.S. PATENT DOCUMENTS

| | | | |
|---|---|---|---|
| 5,469,380 A * | 11/1995 | Iio | 365/154 |
| 6,091,626 A * | 7/2000 | Madan | 365/154 |
| 7,336,533 B2 * | 2/2008 | Hunter et al. | 365/185.07 |
| 7,920,409 B1 | 4/2011 | Clark et al. | |
| 8,284,593 B2 * | 10/2012 | Russell et al. | 365/154 |
| 2010/0118597 A1 | 5/2010 | Song et al. | |
| 2010/0124099 A1 | 5/2010 | Wu et al. | |
| 2011/0116329 A1 | 5/2011 | Koike | |

OTHER PUBLICATIONS

International Search Report and Written Opinion issued for International Patent Application No. PCT/US2012/032688, mailed on Dec. 26, 2012, 9 pages.

* cited by examiner

*Primary Examiner* — Gene Auduong
(74) *Attorney, Agent, or Firm* — Blakely, Sokoloff, Taylor & Zafman LLP

(57) ABSTRACT

Embodiments for data dependent boosted (DDB) bit cells that may allow for smaller minimum cell supplies (Vmin) without necessarily having to increase device dimensions are presented.

20 Claims, 2 Drawing Sheets

CIRCUITS AND METHODS FOR MEMORY

TECHNICAL FIELD

The present invention relates generally to memory circuits and in particular, to dynamic read port circuits.

BACKGROUND

The minimum operational supply voltage (Vccmin) is an important parameter of today's processors. Reducing Vccmin is an important way to reduce the power consumption of a processor. Register files (RF) memory cells, commonly used for cache, inside the processor are the limiting blocks in reducing Vccmin. RF Vccmin is typically the maximum of three components: write Vccmin, read Vccmin, and retention Vccmin.

FIG. 1 shows a conventional, so-called "8T" register file (RF) bit cell having a separate read port for decoupled read operation. Read Vmin is determined by the Local Bit-Line (LBL) evaluation delay and/or LBL noise. Keeper devices p-type transistors, (K1-K3) are used to mitigate the noise impact. Due to contention between pull-down devices (N6, N7) of the read port and those of the keeper devices, the LBL evaluation delay is affected by Vmin, i.e., as Vmin goes down, the LBL delay typically increases.

Unfortunately, with the read port circuit of FIG. 1, the amount to which Vmin may be lowered is limited, e.g., primarily due to the variations in the read port bottom transistor (N7) and increased keeper strength due to width quantization. Accordingly, new approaches may be desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments for data dependent boosted (DDB) bit cells that may allow for smaller minimum cell supplies (Vmin) without necessarily having to increase device dimensions are presented. In fact, in some embodiments, Vmin may be reduced from 220 to 260 mV (e.g., down to around 0.6 V) for up to, or even in excess of, 64 bit cells on each local bit line (LBL).

In some embodiments, the drive strength of a read port data transistor (e.g., N7) may be improved, during a read operation, by capacitively coupling a rising transition from the asserted read word line onto the gate of the read port data transistor.

Figure 2:
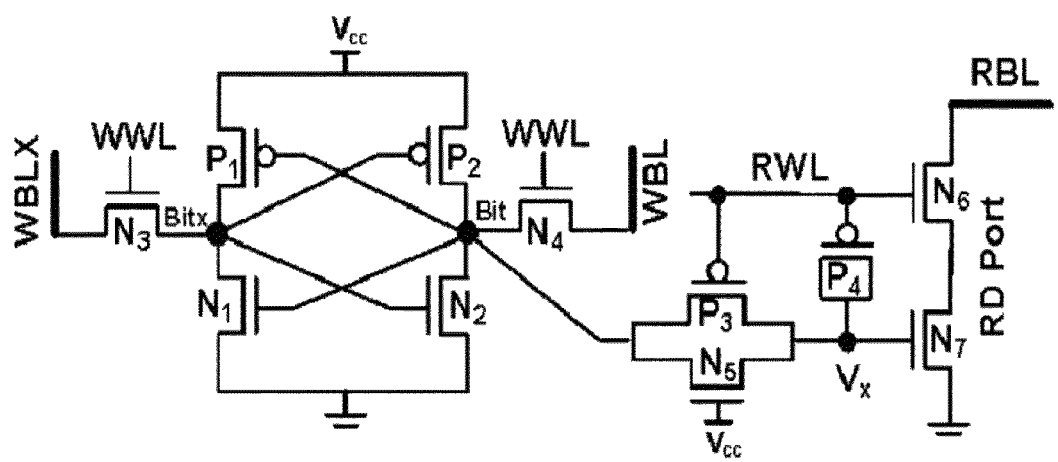
FIG. 2 shows a bit cell circuit having a read port with data dependent boosting in accordance with some embodiments.

FIG. 2 shows a bit cell circuit with data dependent boosting in accordance with some embodiments. The circuit incorporates a data pass device formed from N5 and P3, along with a coupling capacitor formed from p-type transistor P4. (Any type of capacitor, depending on available options for a given process, may be used. In many CMOS processes, capacitors are derived from transistors such as a PMOS transistor with the source and drain connected together for one terminal and the gate used for the other terminal. Also note that the data pass device is made from P and N devices in a quasi pass gate arrangement. In this embodiment, the N device is always on. It should be appreciated, however, that any suitable coupling pathway could be used. For example, the N device, N5, could be omitted, although both P and N devices may be desired for more effective coupling of both logic '1s and logic '0s. In fact, with some embodiments, the entire pass device could be omitted, with just the capacitor P4 used to capacitively couple the RWL to the data transistor gate.)

In the depicted embodiment, there is capacitive coupling to the data transistor's gate (Vx) through the gate-to-source capacitance of switch capacitor P3, as well as from capacitor P4. In some embodiments, the separate capacitor (P4) could be omitted if the gate-source capacitance of P3 is sufficient. Note also that in some schemes, the RWL node may be boosted.

Figure 3:
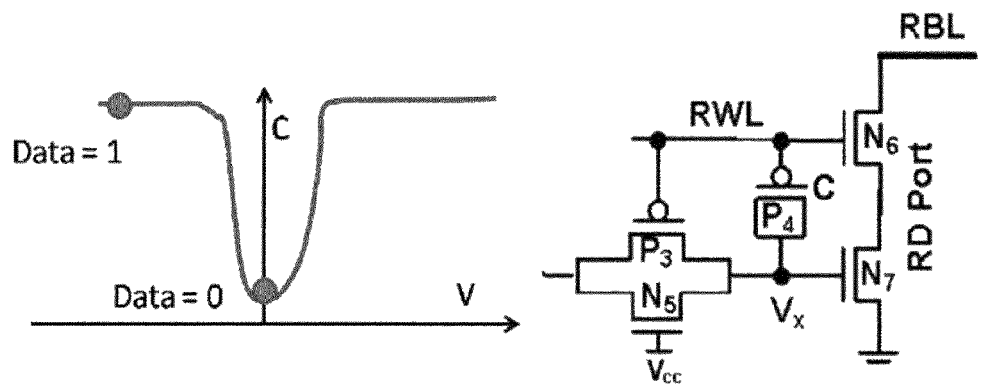
FIG. 3 illustrates data dependent capacitance for capacitive coupling in accordance with some embodiments.

FIG. 3 illustrates data dependent capacitance for capacitive coupling in the circuit of FIG. 2 in accordance with some embodiments. it shows how the capacitance of P4, the capacitively-configured p-type transistor, is dependent on the value of the bit (Bit) in the bit cell. In the depicted graph, the x-axis V represents the voltage across P4 ($V_{RWL}-V_{Vx}$). For stored bit cell data='1, transistor P4 is in an inversion region (RWL=0, Vx=1) providing a higher gate capacitance, and thus, a higher capacitance across P4. On the other hand, for stored bit cell data='0, transistor P4 is in a depletion region (RWL=0, Vx=0) resulting in P4 having a reduced capacitance. Thus, the data dependent capacitance is beneficial with this configuration because it is higher when Vx is to turn on N7 (bit cell data is '1), and it is lower when Vx is to sufficiently keep N7 turned off (data is '0).

With reference to both FIGS. 2 and 3, operation will now be described. When a '1 is read, internal node (data transistor gate node Vx) is initially at Vcc (since P3 is on with RWL being Low. When RWL is asserted (High), the rising transition on RWL gets capacitively coupled to node Vx (data transistor gate), which causes the data transistor (N7) to be driven stronger. Therefore, a smaller Vmin may be tolerated.

In some embodiments, in addition to using capacitive coupling, the RWL signal may be boosted, when asserted, for a read operation. With Vx being capacitively coupled to RWL, this not only causes the word line transistor (N6) to be driven harder, but also, it causes the data transistor (N7) to be driven harder as well. This can result in further improvement for LBL evaluation, even if the Vmin is reduced. For some embodiments, through analysis, it is believed that when RWL boosting is employed, increasing the RWL voltage to a level of about 30% above Vcc for a read operation may achieve desired read operation performance, e.g., when the data bit is a logic '1. On the other hand, with respect to read performance for when the data bit is a logic '0, lower RWL boosting may be desired in some cases from a noise perspective.

For the case with Bit at '1, transistor N5 acts as a clipper (gate=Vcc, source=V(Bit)=Vcc and drain=Vx=Vcc+(capacitive coupling boost from RWL)) This means that N5 inhibits Vx from discharging below Vcc when a '1 is to be read. Device P3 allows Vx to be driven to Vcc when stored data is a '1, and it helps to capacitively couple the read word line (RWL) to Vx but at the same time, limits the maximum value of Vx=V(RWL)+$V_T$ (threshold voltage for P3).

For the case when a logic '0 is to be read (Bit='0), the internal node (Vx) is initially at Vss and N7 is turned off. When RWL is asserted (High), node Vx momentarily rises above Vss due to the capacitive coupling from the RWL Low-to-High transition. Transistors N5 and N2 then restore node Vx to Vss, reducing the impact of the RWL coupling on the LBL noise for the read '0 case.

The N-type transistor (N5) coupling the bit cell to the data transistor gate input (Vx) may or may not be needed, depending on the operating parameters of the circuit. In the depicted embodiment, it couples the Bit node (Vss when Bit is '0) to the data transistor input, thereby functioning to keep the data transistor (N7) sufficiently turned off during evaluation when Bit is a logic '0, notwithstanding the temporary boost at Vx from the RWL node being capacitively coupled to it. However, with the voltage across P4 at 0 (prior to evaluation when RWL='0, Vx='0) the capacitance for P4 will be at a minimum and thus, the RWL rise may not be sufficiently coupled to the Vx node to problematically turn on N7. The reduced amount of coupling from P4 will at least help and if necessary, other solutions might be employed to maintain the voltage at Vx sufficiently small.

Figure 1:
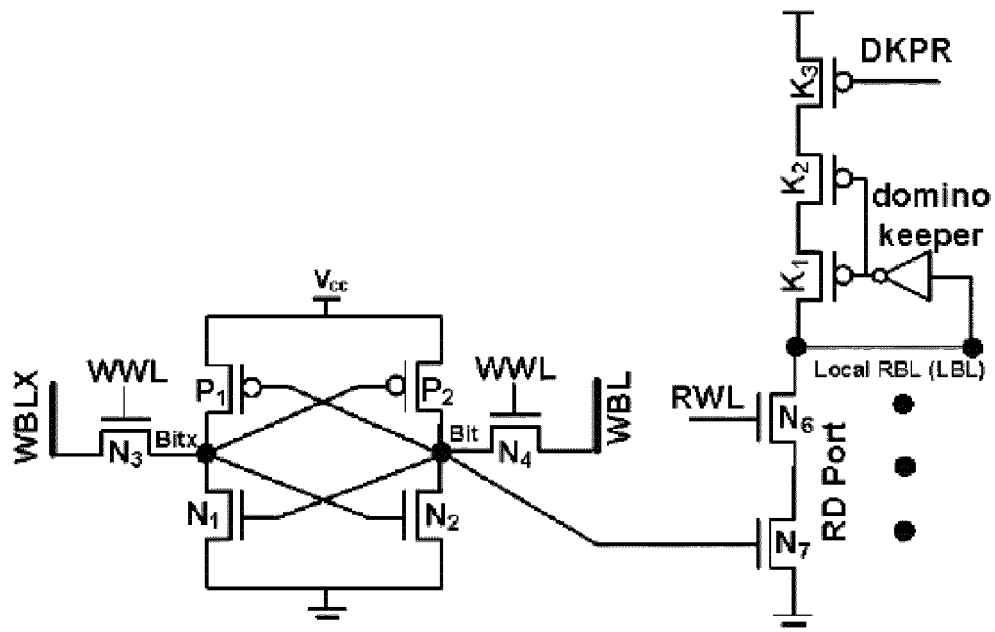
FIG. 1 shows a conventional bit cell circuit with a read port.

It should be appreciated that with some embodiments, in addition to better LBL evaluation, other benefits may be available. For example, with bit cells having DDB features as described in FIG. 2, improved diffusion balancing may result. The DDB cell of FIG. 2 has 4 PMOS and 7 NMOS devices, as contrasted with the conventional cell of FIG. 1, which has 2 PMOS and 6 NMOS devices. Accordingly, the DDB cell has a more balanced P/N diffusion density.

Figure 4:
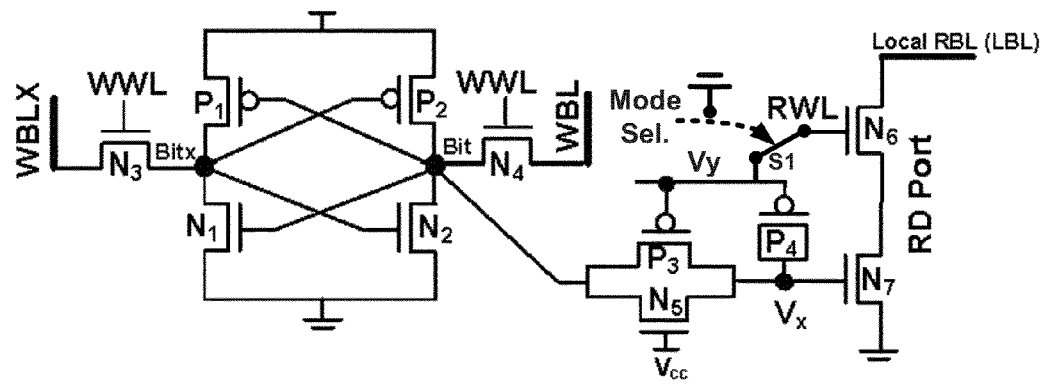
FIG. 4 shows a bit cell circuit having a read port with a selectably engageable data dependent boosting circuit in accordance with some embodiments.

FIG. 4 shows a DDB bit cell of FIG. 2 with a selectably engageable DDB circuit for high and low Vcc operational modes. During a high Vcc voltage mode (e.g., with Vcc around 1 V), the Vx voltages should typically not exceed Vmax (a maximum allowed voltage that a device can reliably tolerate). Hence, a mode select feature is provided to selectably disengage the capacitive device(s) from the RWL node to at least reduce Vx boosting when Vcc is at a higher voltage. A switch (S1), controlled by a mode select (Mode Sel.) signal connects the capacitor coupling node (Vy) to Vss when the circuit is in the higher Vcc mode. On the other hand, it connects the capacitor coupling node to the RWL node when in the lower (e.g., Vcc=Vmin) mode. In this way, the DDB is enabled, when most needed, for lower supply levels and de-activated when the supply is higher, when DDB is not as helpful and could actually potentially be destructive.

DDB cells, in accordance with embodiments disclosed herein, could be used in a variety of different memory structures for a variety of different computing platforms. For example, they could be used in dynamic register file arrays, e.g., for so-called cache memory systems. Furthermore, any type of computing systems such as mobile personal computers, PDAs, cell phones, tablets, server computers, or the like could exploit memory cells with DDB as taught herein.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit (IC) chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the presented figures, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip comprising:
   a read port of a memory cell, the read port comprising:
   a read word line (RWL) node;
   a data transistor control node; and
   a capacitive device to be coupled to the RWL node and to the data transistor control node to capacitively couple or decouple the RWL node to or from the data transistor control node.

2. The chip of claim 1, wherein the capacitive device comprises a transistor.

3. The chip of claim 2, wherein the transistor is a p-type CMOS transistor.

4. The chip of claim 3, wherein the transistor has a source terminal and a drain terminal coupled together and coupled to the data transistor control node.

5. The chip of claim 1, further comprising an n-type transistor coupled between the data transistor control node and a bit node of the memory cell.

6. The chip of claim 5, further comprising a p-type transistor coupled between the data transistor control node and the bit node, the p-type transistor having a gate coupled to the RWL node.

7. The chip of claim 1, wherein the capacitive device is selectively coupled to the RWL node, wherein for a first operational mode, the capacitive device is to be coupled to a supply reference and for a second, lower supply level operational mode, the capacitive device is to be coupled to the RWL node.

8. The chip of claim 1, wherein the memory cell is part of a dynamic register file array.

9. The chip of claim 1, wherein the memory cell is part of a group of at least 64 memory cells coupled to a common local bit line.

10. An apparatus comprising:
    a bit line having a plurality of bit cells with bit nodes and read ports coupled to the bit line, each read port comprising:
    a read word line (RWL) node to control an RWL transistor;
    a data transistor node to control a data transistor; and
    a selectably engageable capacitive device to be coupled between the RWL node and the data transistor node to capacitively couple or decouple the RWL node to or from the data transistor node.

11. The apparatus of claim 10, wherein the capacitive device comprises a transistor.

12. The apparatus of claim 11, wherein the transistor is a p-type CMOS transistor.

13. The apparatus of claim 12, wherein the transistor has a source terminal and a drain terminal coupled together and coupled to the data transistor node.

14. The apparatus of claim 10, further comprising an n-type transistor coupled between the data transistor node and the bit node of its memory cell.

15. The apparatus of claim 14, further comprising a p-type transistor coupled between the data transistor node and the bit node, the p-type transistor having a gate terminal coupled to the RWL node.

16. The apparatus of claim 10, wherein the bit line is part of a dynamic register file array.

17. The apparatus of claim 10, wherein the plurality of bit cells includes at least 64 memory cells.

18. A method comprising:
    asserting a read word line node, from a low to a high transition, to turn on a read word line transistor; and
    capacitively coupling a voltage bump onto a data transistor node from the read word line node off of the low to high transition.

19. The method of claim 18, comprising adding the voltage bump onto a logical high voltage level when the data transistor is to turn on for reading a logic '1.

20. The method of claim 19, wherein the logic '1 is coupled to the data transistor node from a bit cell by way of a PMOS transistor.

* * * * *

UNITED STATES PATENT AND TRADEMARK OFFICE
CERTIFICATE OF CORRECTION

| | | |
|---|---|---|
| PATENT NO. | : 8,488,390 B2 | Page 1 of 1 |
| APPLICATION NO. | : 13/174352 | |
| DATED | : July 16, 2013 | |
| INVENTOR(S) | : Kulkarni et al. | |

It is certified that error appears in the above-identified patent and that said Letters Patent is hereby corrected as shown below:

Specification

Please insert in column 1, line 3 before TECHNICAL FIELD:

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*